(12) United States Patent
Jow

(10) Patent No.: US 7,433,199 B2
(45) Date of Patent: Oct. 7, 2008

(54) SUBSTRATE STRUCTURE FOR SEMICONDUCTOR PACKAGE AND PACKAGE METHOD THEREOF

(76) Inventor: En-Min Jow, 11F, No. 38-15, Lane 72, Kwang Hwa 2nd Street, Hsinchu City (TW) 300

( * ) Notice: Subject to any disclaimer, the term of this patent is extended or adjusted under 35 U.S.C. 154(b) by 0 days.

(21) Appl. No.: 11/701,411

(22) Filed: Feb. 2, 2007

(65) Prior Publication Data

US 2007/0252269 A1 Nov. 1, 2007

(30) Foreign Application Priority Data

Jan. 5, 2007 (TW) .............................. 96100488 A

(51) Int. Cl.
*H05K 7/20* (2006.01)

(52) U.S. Cl. ...................................... 361/752; 361/715

(58) Field of Classification Search ................. 361/752, 361/790, 797, 800
See application file for complete search history.

(56) References Cited

U.S. PATENT DOCUMENTS

| | | | | |
|---|---|---|---|---|
| 4,531,176 A | * | 7/1985 | Beecher, II | ................. 361/816 |
| 5,892,660 A | * | 4/1999 | Farnworth et al. | .......... 361/728 |
| 7,008,825 B1 | * | 3/2006 | Bancod et al. | .............. 438/123 |
| 7,145,779 B2 | * | 12/2006 | Lien | ........................... 361/729 |
| 2005/0146856 A1 | * | 7/2005 | Lien | ........................... 361/728 |

* cited by examiner

*Primary Examiner*—Hung S Bui
(74) *Attorney, Agent, or Firm*—Rosenberg, Klein & Lee

(57) ABSTRACT

A substrate structure for a semiconductor a package and a package method thereof are disclosed. A plurality of independent module substrates are arranged on a metal or heat-resistant frame that has a hollow portion and those module substrates are suspended and connected with the frame by a plurality of connecting bars. A molding component is utilized to respectively cover those module substrates. Then punch, and grind the plurality of rugged bumps of those connecting bars to form a plurality of independent module packages, wherein the cover area of the molding component is larger than the size of each the module substrate. The metal or heat-resistant frame is utilized to replace the conventional side rail design so as to increase the usable area of the substrate to substantially come to the cost reduction of the substrate.

28 Claims, 6 Drawing Sheets

SUBSTRATE STRUCTURE FOR SEMICONDUCTOR PACKAGE AND PACKAGE METHOD THEREOF

BACKGROUND OF THE INVENTION

1. Field of the Invention

The present invention relates to a semiconductor packaging technology, and more particularly, to a substrate structure for a semiconductor package and its package method.

2. Description of the Prior Art

Accordingly, along with the rapid progress of the function of the products about the computers and the network communication, the semiconductor technology must meet the requirements of the diversification, the portablility and small size so that it is a tendency to develop towards high-precision manufacturing process such as producing the high-power, high-density, small-sized and miniaturized packaging elements. In addition, the electronic packaging still need to meet characteristics, such as high reliability, good heat dissipation and so forth, for the signal or power transmission so as to provide a good heat-dissipation path and functions of a structural protection and support.

A conventional semiconductor structure such as shown in FIG. 1, FIG. 1 is a top-view diagram to illustrate the conventional structure of semiconductor manufacturing method. To arrange a plurality of module substrates 120 on a substrate 110, after placing the chips (not shown) on the proper locations, then utilize the molding compound 130 to cover the whole surface of the substrate 110, which includes those module substrates 120. Waiting until the molding compound 130 is hardened, exploiting the water jet or the laser-cutting machine (not shown) to separate the substrate 110 to a plurality of single packages. However, after cutting, the remainder portion of the substrate(such as the portion between two dotted line, depicted as the dual-arrow points in FIG. 1) would be the waste materials which can not be recycled so that the cost of the substrate is an important issue all the time.

Consequently, how to overcome the questions hereinabove is a necessary and urgent issue for most manufacturers.

SUMMARY OF THE INVENTION

According to the issue mentioned previously, the present invention is to provide a substrate structure for a semiconductor package and its package method.

One object of the present invention is to provide a substrate structure for a semiconductor package and its package method which utilizes the low-cost metal frame or heat-resistant frame to replace conventional side rail design of the substrate so as to substantially reduce the cost of the substrate.

One object of the present invention is to provide a substrate structure for a semiconductor package and its package method which utilizes the frame-free substrate design and the usage of the low-cost metal frame or heat-resistant frame so as to avoid the side rail of the substrate becomes waste material.

One object of the present invention is to provide a substrate structure for a semiconductor package and its package method, to arrange a plurality of module substrates and a plurality of connecting bars on a substrate. When processing the molding steps, it just needs injecting the molding component into each of the module substrates and parts of the connecting bars instead of injecting the molding component into the whole substrate. As this result, the present invention avoids the waste of the molding component and reduces the cost of the molding component.

To achieve the objects mentioned above, one embodiment of the present invention is to provide a substrate structure for a semiconductor package, which includes: a frame with at least a hollow portion; and a substrate suspending on the frame, wherein the substrate includes a plurality of module substrates and a plurality of connecting bars, and every one of those module substrates connects to each other with at least one of those connecting bars; and some of those connecting bars overlap with the frame and the hollow portion of the frame has at least one of those module substrate suspending aloft.

To achieve the objects mentioned above, another embodiment of the present invention is to provide a package method of substrate structure for a semiconductor package, which includes: providing a frame with at least a hollow portion; providing a substrate, wherein the substrate includes a plurality of module substrates and a plurality of connecting bars, and every one of the module substrates connect to each other with at least one of the connecting bars; disposing the substrate on the frame, wherein some of the connecting bars overlap with the frame, and the module substrates suspend on the hollow portion; and forming a molding component respectively to cover every one of the module substrates and some portion of the connecting bars, wherein the cover area of the molding component is larger than the size of every one of the module substrates.

To achieve the objects mentioned above, another embodiment of the present invention is to provide a semiconductor package structure applying on the abovementioned substrate structure for a semiconductor package, which includes: a frame provided with a hollow portion; a substrate with a plurality of module substrates and a plurality of connecting bars, wherein every one of those module substrates connects to each other with at least one of those connecting bars; part of those connecting bars overlap with the frame; and those module substrates suspend on the hollow portion; and a molding component covering every one of those module substrates and part of said connecting bars, wherein the cover area of the molding component is larger than the size of every one of those module substrates.

Other objects, technical contents, features and advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The detailed explanation of the present invention is described as following. The described preferred embodiments are presented for purposes of illustrations and description, and they are not intended to limit the scope of the present invention.

Figure 1:
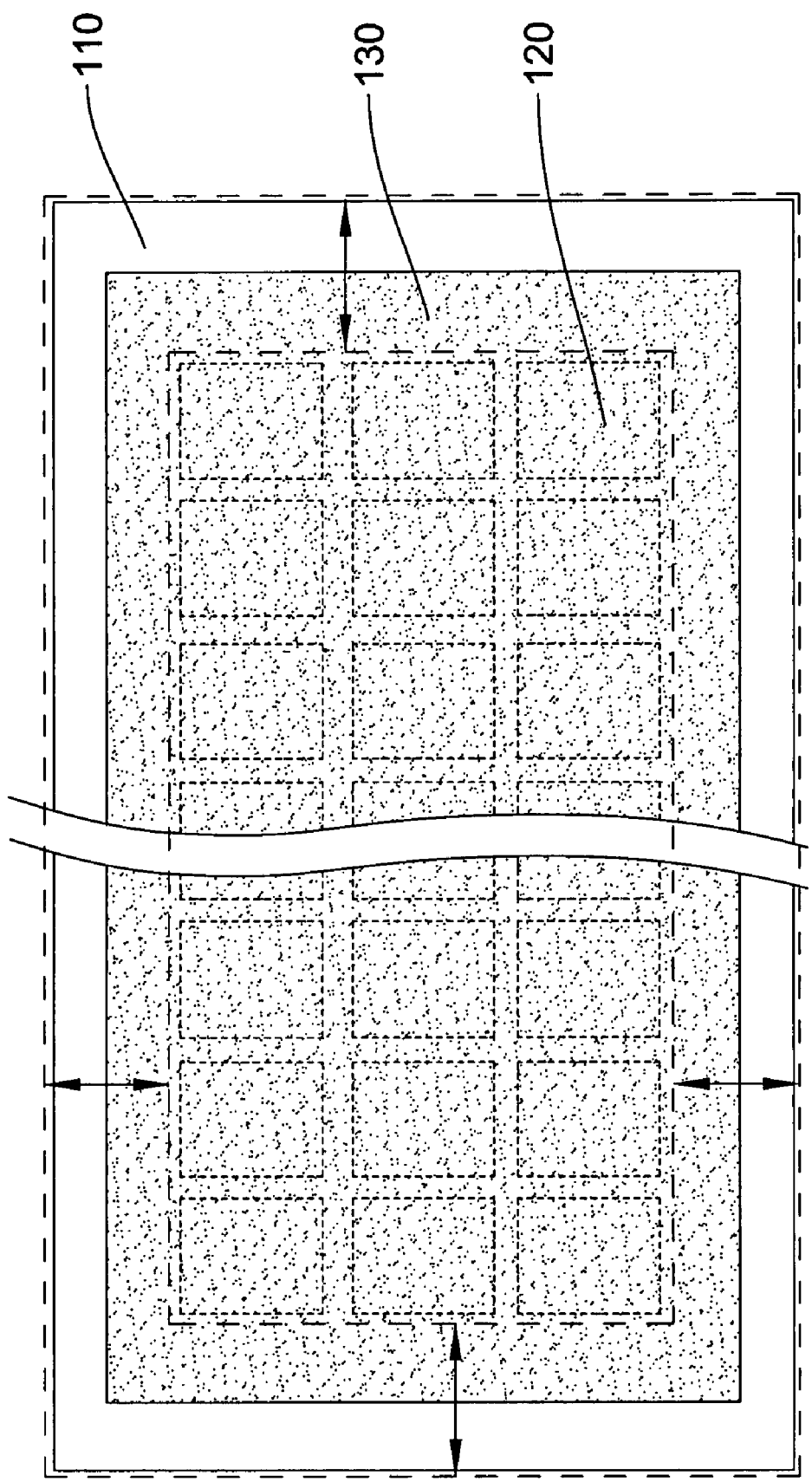
FIG. 1 is the top-view schematic diagram to illustrate the conventional structure of semiconductor manufacturing method.
Figure 2A:
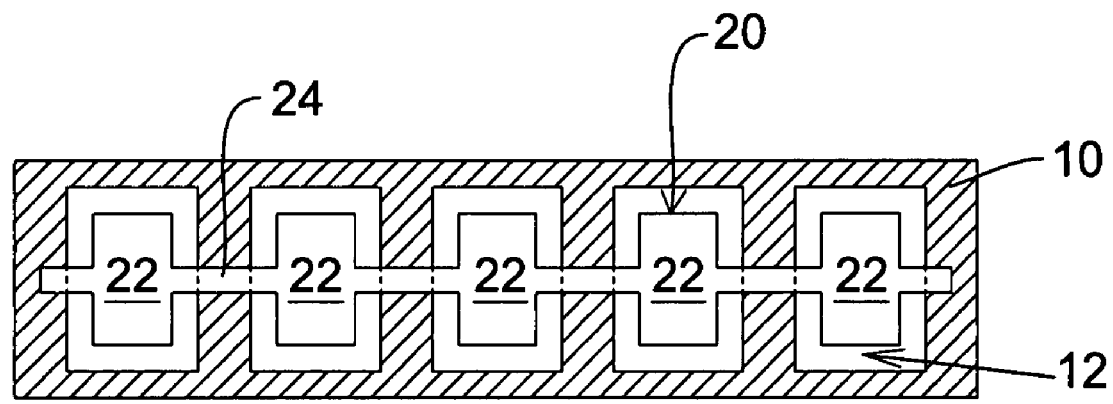
FIG. 2A is the top-view schematic diagram to illustrate the substrate structure for a semiconductor package according to one embodiment of the present invention.

Firstly, referring to FIG. 2A, FIG. 2A is the schematic diagram to illustrate the substrate structure for a semiconductor package according to one embodiment of the present invention. Such as shown in the figure, the substrate structure for a semiconductor package includes a frame 10 provided with at least a hollow portion 12; and a substrate 20 suspending on the frame 10, wherein the substrate 20 has a plurality of module substrates 22 and a plurality of connecting bars 24, and every one of those module substrates 22 connects to each other with at least one of those connecting bars 24; and some of those connecting bars 24 overlap with the frame 10 and the hollow portion 12 of the frame 10 has at least one of those module substrates 22 suspending aloft. In the embodiment, for utilizing the substrate more efficiently, the material of the substrate 10 can be low-cost metal or heat-resistant material. In one embodiment, the range of thermostability can be from 120 degrees centigrade to 260 degrees centigrade; and the metal can be copper, iron, aluminum et cetera. The conventional substrate side rail can be replaced by the metal or heat-resistant material so as to substantially reduce the cost of the substrate. In addition, as shown in the figure, every one of those module substrates 22 suspending on every hollow portion 12 is easy to perform the later package process. During the molding process, it just needs injecting the molding component into the module substrates 22 and part of the connecting bars 24 instead of injecting the molding component into the whole substrate. As this result, this method can avoid the waste of the molding component and reduce the cost of the molding component.

Continuing the above description, in another embodiment, the substrate 20 can be fixed on the frame 10 or beneath the frame 10 by an adhesion method or a welding method (the substrate 20 is set on the frame 10 in the figure). Therefore, the substrate structure for the semiconductor package further includes an adhesion layer (not shown in the figure) disposing between part of the connecting bars 24 and the frame 10; or probably, further includes a metal layer (not shown in the figure) disposing between part of the connecting bars 24 and the frame 10. Besides, it can be comprehended that the amount, the size and the shape of these hollow portions 12 of the frame 10, the module substrates 22 and the connecting bars 24 can not be limited in the illustrated figure, this is just an embodiment.

Figure 2B:
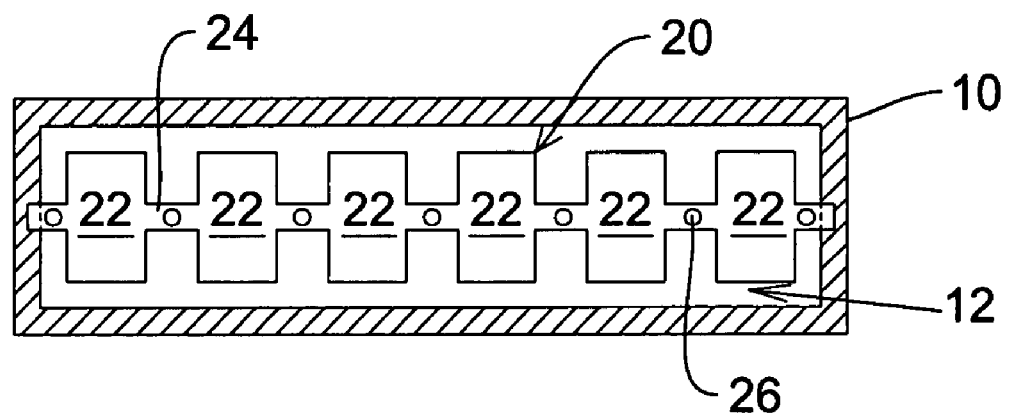
FIG. 2B is the top-view schematic diagram to illustrate the substrate structure for a semiconductor package according to another one embodiment of the present invention.

Continuously, please refer to FIG. 2B, FIG. 2B is the top-view schematic diagram to illustrate the substrate structure for a semiconductor package according to another embodiment of the present invention. As shown in the figure, the frame 10 can have only one hollow portion 12, and the substrate 20 can be fixed on the frame 10 or beneath the frame 10 by part of the connecting bars 24; module substrates 22 also can be suspended over the hollow portion 12 by utilizing part of connecting bars 24. In another embodiment, in order to singulate each module substrate 22 conveniently after packaging, the substrate structure further includes at least one through hole 26 or indent formed on at least any one of the connecting bars 24.

Figure 3A:
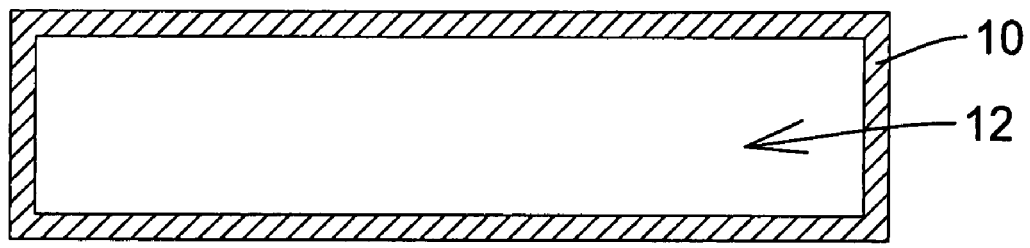
FIG. 3A, FIG. 3B, FIG. 3C, FIG. 3D, and FIG. 3E, are the top-view schematic diagrams to illustrate the package method of the substrate structure for the semiconductor package according to one embodiment of the present invention.
Figure 3B:
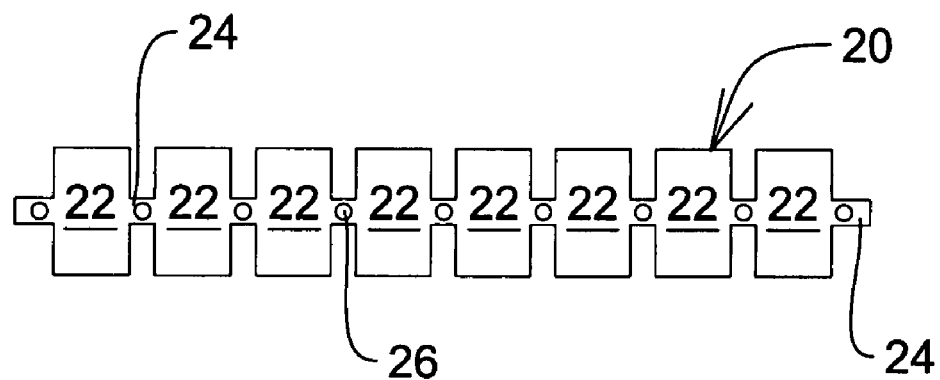
Figure 3C:
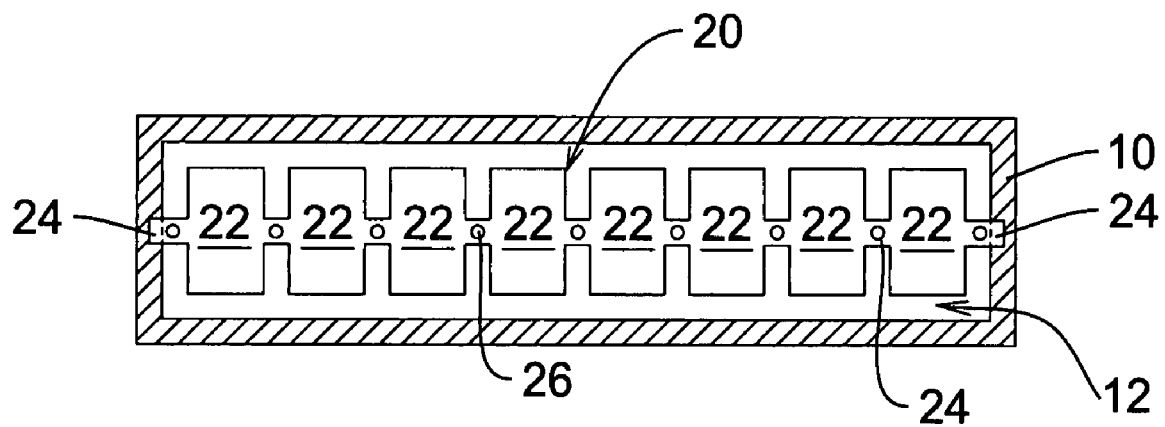
Figure 3D:
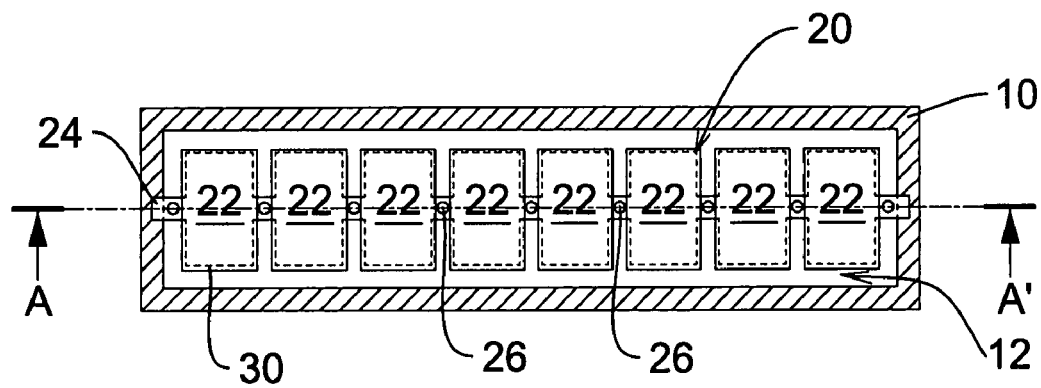
Figure 3E:
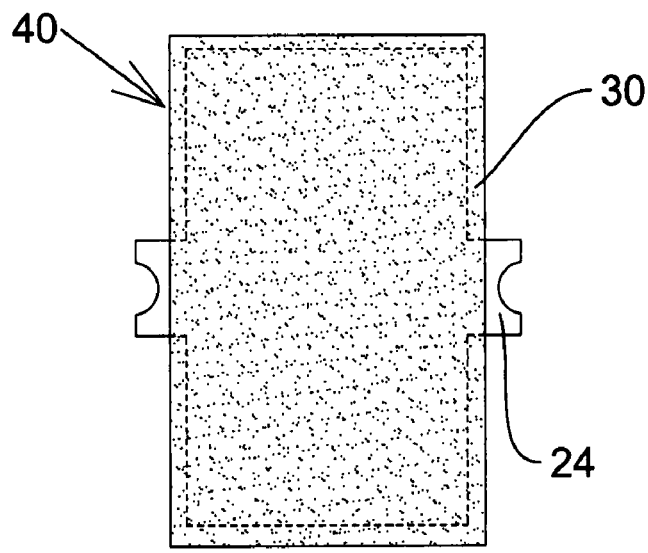

Referring to FIG. 3A, FIG. 3B, FIG. 3C, FIG. 3D, and FIG. 3E, FIG. 3A, FIG. 3B, FIG. 3C, FIG. 3D, and FIG. 3E, are the top-view schematic diagrams to illustrate the package method of the substrate structure for the semiconductor package according to one embodiment of the present invention. Referring to FIG. 3A firstly, a frame 10 is provided with at least a hollow portion 12, in one embodiment, the frame 10 can be formed by chemical etching or mechanical punching, wherein the frame 10 can be made of metal or heat-resistant material. Next, as shown in FIG. 3B, a substrate 20 is provided with a plurality of module substrates 22 and a plurality of connecting bars 24, and every module substrate 22 connects to each other by at least one of the connecting bar 24. In one embodiment, the package method further includes at least one through hole 26 or indent formed on at least any one of the connecting bars 24 by an appropriate method so as to implement the singulation process later. Further, refer to FIG. 3C, the substrate 20 is disposed on the frame 10, wherein part of the connecting bars 24 overlap with the frame 10, and the module substrates 22 suspend on the hollow portion 12. In one embodiment, the substrate 20 is stacked on the frame 20 or beneath the frame 10 with such as an epoxy or an adhesive element by utilizing an adhesion method; besides, the substrate 20 also can be fixed on the frame 10 or beneath the frame 10 by utilizing a welding method. In one embodiment, the present invention further includes a chip (not shown in the figure) set on each of the module substrates 22, and the chip electrically connects to the module substrate 22 where it is set on. The chip can electrically connect with the module substrate 22 by a wire bonding method or a ball mounting method. Finally, as shown in FIG. 3D, a molding component 30 is formed to respectively cover each of the module substrates 22 and part of the connecting bars 24, wherein the cover area of the molding component 30 is larger than the size of every module substrate 22. In one embodiment, an upper-mold substrate and a lower-mold substrate are utilized to form the molding component 30 by a molding process. The upper-mold substrate and the lower-mold substrate cooperate to define a cavity to make the molding component 30 directly be molded as a chamfered standard profile. In another embodiment, if the lower-mold substrate only provides the supporting effect, the lower-mold substrate can be replaced with a bearing plate or other base substrate.

Following the foregoing description, while the package process completed and the molding component 30 is hardened, the process further includes a singulation process to separate those connecting bars 24 to form a plurality of module packages 40. In one embodiment, a punch device is utilized to separate those connecting bars 24 to form the package structure shown in FIG. 3E. As shown in the figure, in the cause of avoiding the peeling of the molding component 30 or the crack of the module packages 40 because the punch location is excessively close to the module package 40 when punching, the punch location would be apart from those module packages 40. Therefore, after punching, the module packages 40 have a plurality of bumps in the edge; these bumps are part of the original connecting bars 24 of the substrate 20.

Consequently, after separating those module packages 40, a remove process is further included to discard those bumps of those module packages 40. After grinding, polishing, and smoothing, the module packages 40 will comply with the international standard size.

Figure 3F:
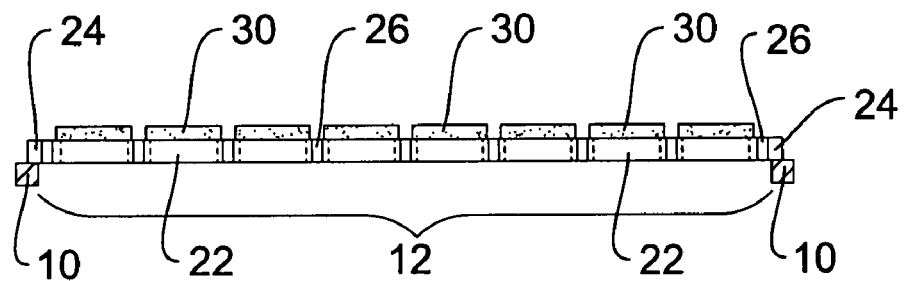
FIG. 3F is the side view of AA' cross-section line of FIG. 3D to illustrate the semiconductor package structure according to one embodiment of the present invention.

Next, referring to FIG. 3D and FIG. 3F, FIG. 3D illustrates the top-view schematic diagram according to the forementioned substrate structure for the semiconductor package by utilizing the forementioned process of one embodiment of the present invention. FIG. 3F illustrates the side view of AA' cross-section line of FIG. 3D. As shown in the figure, the semiconductor package structure includes a frame 10 provided with at least a hollow portion 12, wherein the material of the frame 10 can be the metal or the heat-resistant material. A substrate 20 has a plurality of module substrates 22 and a plurality of connecting bars 24, wherein every module substrate 22 can connect with each other by at least one of the connecting bars 24 to form a one-piece form structure. Such as shown in the figure, part of the connecting bars 24 overlap with the frame 10, wherein the substrate 20 can not be limited to set on the frame 10, according to different fixing method, the substrate 20 also can be disposed beneath the frame 10. In other words, no matter where the substrate 20 is set, part of the connecting bars 24 should overlap with part of the frame 10. Besides, the module substrates 22 is suspended with the hollow portion 12. In the embodiment, the structure further includes a chip(not shown in the figure) set on the proper location of the module substrates 22, and the chip can electrically connect to the module substrate 22 which it is set on by a wire bonding method or a ball mounting method. A molding component 30 separately cover every one of the chip, every one of the module substrates 22 and part of the connecting bars 24, wherein the cover area of the molding component 30 is larger than the size of every module substrate 22. In addition, the material of the molding component 30 includes epoxy.

Following the forgoing description, in one embodiment, the molding component 30 is formed by utilizing an upper-mold substrate and a lower-mold substrate with a molding method so as to directly mold as a chamfered standard profile. Additionally, in the cause of punching the substrate 20 to form a plurality of independent module packages, the substrate 20 further includes at least one through hole 26 or indent set on at least any one of the connecting bars 24. The present invention utilizes the frame 10 to replace the conventional side rail of the substrate to substantially come to cost reduction of the substrate, and so as to increase utility rate of the substrate.

Figure 4:
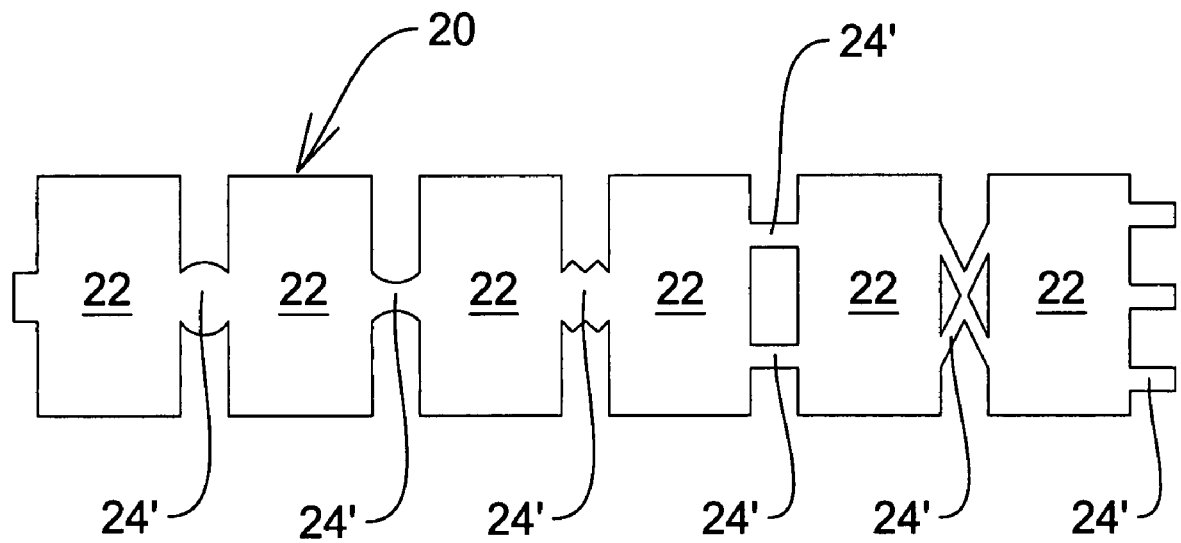
FIG. 4 is the schematic diagram to illustrate the shape, the distribution, and the amount of the connecting bars according to different embodiments of the present invention.

FIG. 4 is the schematic diagram to illustrate the shape, the distribution, and the amount of the connecting bars 24' according to a different embodiment of the present invention. These connecting bars 24' would be utilized to connect with each one of the module substrates 22, therefore, the amount, the location, the shape, and the size of these connecting bars 24' can not be limited in the drawing shown in the abovementioned embodiment. Depending on the different arrangements of the module substrates 22 on the substrate 20, the amount, the location, the shape, and the size of these connecting bars 24' can be variable, and the shape of these connecting bars 24' is in polygon shape, bar-like shape, round shape, or multi-radian shape.

Figure 5:
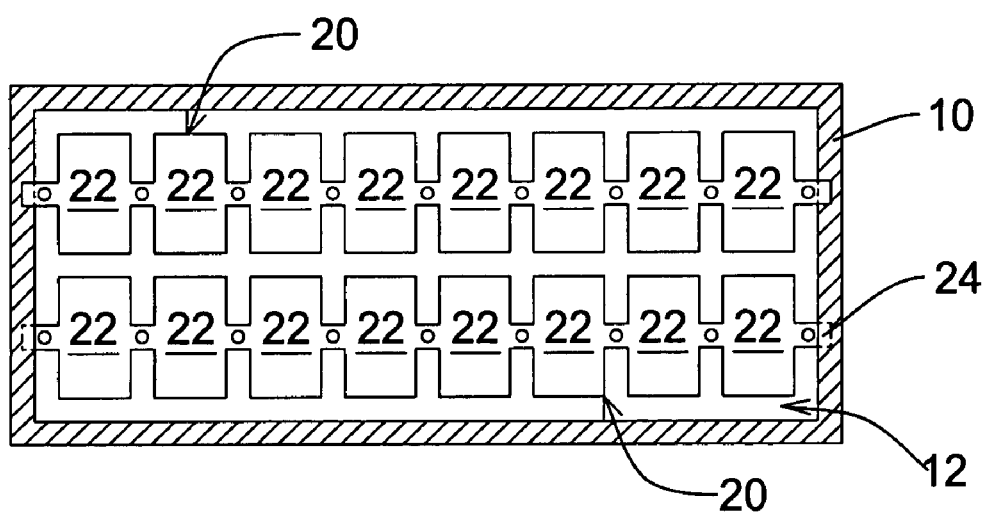
FIG. 5 is the schematic diagram to illustrate the distribution of the substrate according to different embodiments of the present invention.

In addition, please refer to FIG. 5, FIG. 5 is the schematic diagram to illustrate a different arrangement of the substrate 20 set on the frame 10 or beneath the frame 10 according to a different embodiment of the present invention. As shown in the figure, the amount of the substrate 20 overlapped with the frame 10 is not limited as shown in the forementioned embodiments of the present invention. Moreover, more than one substrate 20 also can be set on the frame 10 or beneath the frame 10 so that those module substrates 22 can be suspended on the hollow portion 12 of the frame 10, and can be connected to each other by the connecting bars 24, wherein part of connecting bars 24 are overlapped with the frame 10 over or beneath the frame 10. Hence, the module substrates 22 on the substrate 20 can be designed in varied shape according to different kinds of packages.

Figure 6A:
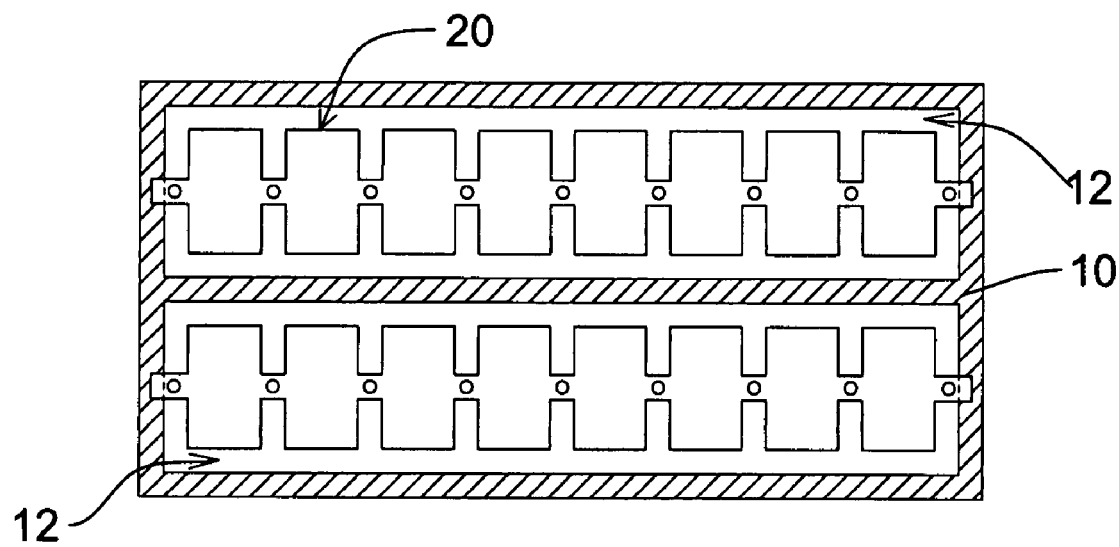
FIG. 6A and FIG. 6B are the schematic diagrams to illustrate the frame structure according to different embodiments of the present invention.
Figure 6B:
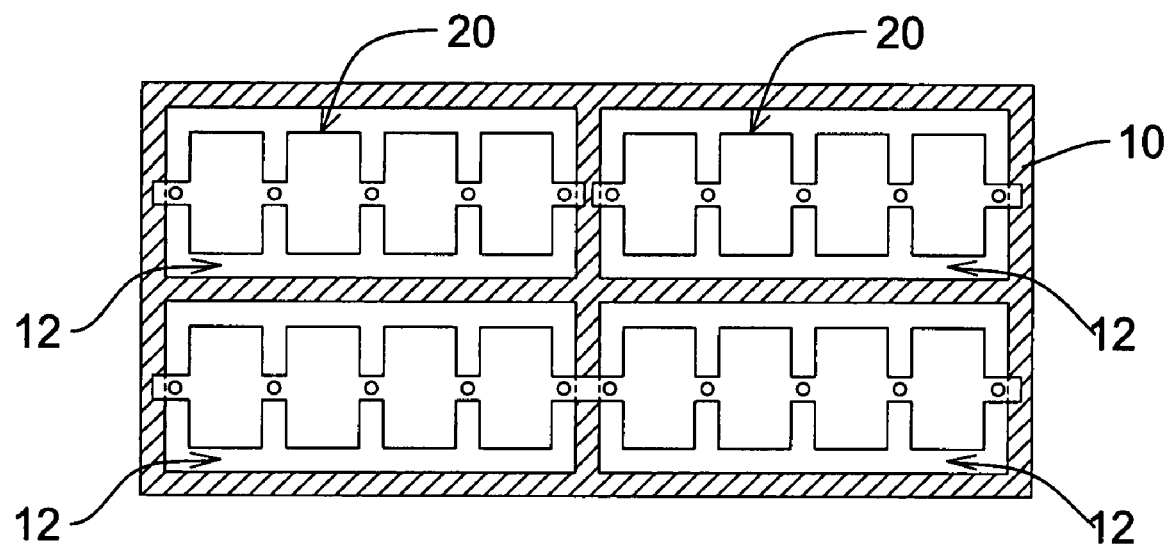

FIG. 6A and FIG. 6B are the schematic diagrams to illustrate the structure of the frame 10 according to different embodiments of the present invention. In the diagram, the shape of the frame 10 is not limited as shown in the forementioned embodiment, according to different designs, the frame 10 also can have a plurality of hollow portions 12 to provide more support to the substrate 20. As shown in FIG. 6B, each of the substrate 20 can be connected or isolated, and the arrangements can not be limited as shown in the figure.

According to the above description, one of features of the present invention is to arrange a plurality of module substrates to link with the substrate by a plurality of connecting bars and every module substrate utilizes part of connecting bars to overlap with the frame over or beneath the frame, wherein the shape, the size, and the amount of the module substrates, the connecting bars and the frame are not limited, which just depend on the mechanical design. Additionally, it utilizes the punch method to separate connecting bars to form a plurality of module packages. Due to the buffer space between the connecting bars and the module packages, it can avoid the peeling of the molding component or the crack of the module packages because the punch location is excessively close to the package when punching so as to raise the production yield. Besides, in the molding process, the molding component would not completely cover the whole substrate but only injet into each one of the module substrates so as to reduce the cost of the molding component.

To summarize, the present invention utilizes the cheaper metal frame or heat-resistant frame to replace the conventional side rail design of the substrate so as to substantially reduce the cost of the substrate. In addition, it utilizes the frame-free substrate design and the usage of the cheaper metal frame or heat-resistant frame so as to avoid the side rail of the substrate to become waste material. Furthermore, to arrange a plurality of module substrates and a plurality of connecting bars on a substrate. When processing the molding steps, it just needs injecting the molding component into every module substrate and part of the connecting bars instead of injecting the molding component into the whole substrate. As this result, the present invention avoids the waste of the molding component and reduces the cost of the molding component.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the Claims appended hereto and their equivalents.

What is claimed is:

1. A substrate structure for a semiconductor package, comprising:
    a frame provided with at least a hollow portion; and
    a substrate suspended on said frame, wherein
        said substrate comprises a plurality of module substrates and a plurality of connecting bars, and every said module substrate connects to each other with at least one of said connecting bar to form a one-piece form structure; and some of said connecting bars overlap with said frame and said hollow portion of said frame having at least one of said module substrate suspended aloft.

2. The substrate structure for a semiconductor package according to claim 1, wherein the material of said frame comprises the metal or the heat-resistant material.

3. The substrate structure for a semiconductor package according to claim 1, further comprising at least a through-hole or an indent formed on at least any one of said connecting bars.

4. The substrate structure for a semiconductor package according to claim 1, further comprising an adhesion layer set between part of said connecting bars and said frame, wherein said adhesive layer is formed by utilizing an adhesion method.

5. The substrate structure for a semiconductor package according to claim 1, further comprising a metal layer set between some of said connecting bars and said frame, wherein said metal layer is formed by utilizing a welding method.

6. The substrate structure for a semiconductor package according to claim 1, wherein said substrate is set on said frame or set beneath said frame.

7. A package method of substrate structure for a semiconductor package, comprising:

providing a frame with at least a hollow portion;

providing a substrate, wherein said substrate comprises a plurality of module substrates and a plurality of connecting bars, and every said module substrate connect to each other with at least one of said connecting bar to form a one-piece form structure;

disposing said substrate on said frame, wherein part of said connecting bars overlap with said frame, and said module substrates suspend on said hollow portion; and forming a molding component to respectively covering every said module substrate and part of said connect bars, wherein the cover area of said molding component is larger than the size of every said module substrate.

8. The package method of substrate structure for a semiconductor package according to claim 7, wherein the material of said frame comprises the metal or the heat-resistant material.

9. The package method of substrate structure for a semiconductor package according to claim 7, further comprising a singulation process to separate every said connecting bar to form a plurality of module packages.

10. The package method of substrate structure for a semiconductor package according to claim 9, further comprising removing said connecting bars protruding from each said module packages.

11. The package method of substrate structure for a semiconductor package according to claim 9, wherein a punch device is utilized to isolate said connecting bars in said singulation process.

12. The package method of substrate structure for a semiconductor package according to claim 7, wherein said molding component is formed by utilizing a molding method.

13. The package method of substrate structure for a semiconductor package according to claim 12, wherein said molding component is directly molded as the chamfered standard profile.

14. The package method of substrate structure for a semiconductor package according to claim 7, further comprising forming at least a through hole or an indent on at least any one of said connecting bars.

15. The package method of substrate structure for a semiconductor package according to claim 7, wherein said substrate is set on said frame or set beneath said frame by utilizing an adhesion method.

16. The package method of substrate structure for a semiconductor package according to claim 7, wherein said substrate is set on said frame or set beneath said frame by utilizing a welding method.

17. The package method of substrate structure for a semiconductor package according to claim 7, further comprising separately disposing a chip on every said module substrate, wherein said chip is electrically connected to said module substrates.

18. The package method of substrate structure for a semiconductor package according to claim 17, wherein said chip electrically connects to said module substrates by utilizing a wire bonding method or a ball mounting method.

19. A semiconductor package structure applied on the substrate structure for a semiconductor package, comprising:

a frame provided with a hollow portion;

a substrate with a plurality of module substrates and a plurality of connecting bars, wherein every said module substrate connects to each other with at least one of said connecting bar to form a one-piece form structure;

part of said connecting bars overlap with said frame;

said module substrates suspend aloft said hollow portion; and a molding component covering every said module substrate and part of said connecting bars, wherein the cover area of said molding component is larger than the size of every said module substrate.

20. The semiconductor package structure according to claim 19, wherein said molding component is formed by utilizing a upper-mold substrate and a lower-mold substrate.

21. The semiconductor package structure according to claim 20, wherein said molding component is directly molded as a chamfered standard profile.

22. The semiconductor package structure according to claim 19, wherein the material of said molding component comprises epoxy.

23. The semiconductor package structure according to claim 19, wherein the shape of said connecting bars is in polygon shape, bar-like shape, round shape, or multi-radian shape.

24. The semiconductor package structure according to claim 19, further comprising at least one through hole or an indent formed on at least any one of said connecting bars.

25. The semiconductor package structure according to claim 19, further comprising a plurality of chips separately set on every said module substrate, and said chips electrically connecting to said module substrates.

26. The semiconductor package structure according to claim 25, wherein said chip electrically connects to said module substrate by utilizing a wire bonding method or a ball mounting method.

27. The semiconductor package structure according to claim 19, wherein the material of said frame comprises the metal or the heat-resistant material.

28. The semiconductor package structure according to claim 19, wherein part of said connecting bars suspend on said frame or beneath said frame.

* * * * *